(12) United States Patent
Keener

(10) Patent No.: US 6,686,914 B2
(45) Date of Patent: Feb. 3, 2004

(54) METHODS AND SYSTEMS FOR AUTOMATICALLY TRANSLATING GEOMETRIC DATA

(75) Inventor: Bryan F. Keener, Greenville, SC (US)

(73) Assignee: General Electric Company, Schenectady, NY (US)

(*) Notice: Subject to any disclaimer, the term of this patent is extended or adjusted under 35 U.S.C. 154(b) by 359 days.

(21) Appl. No.: 09/879,819

(22) Filed: Jun. 11, 2001

(65) Prior Publication Data

US 2002/0194581 A1 Dec. 19, 2002

(51) Int. Cl.⁷ .............................................. G06T 15/00
(52) U.S. Cl. ...................................................... 345/420
(58) Field of Search .............................. 345/419, 420, 345/421, 619

(56) References Cited

U.S. PATENT DOCUMENTS

| | | | |
|---|---|---|---|
| 4,829,446 A | 5/1989 | Draney | 364/488 |
| 4,912,657 A | 3/1990 | Saxton et al. | 364/518 |
| 4,933,865 A | 6/1990 | Yamamoto et al. | 364/518 |
| 5,070,534 A | 12/1991 | Lascelles | 395/155 |
| 5,265,197 A | 11/1993 | Kondo | 395/120 |
| 5,465,324 A | 11/1995 | Lee et al. | 395/133 |
| 5,581,672 A | 12/1996 | Letcher, Jr. | 395/120 |
| 5,615,319 A | 3/1997 | Metzger et al. | 395/127 |
| 5,742,288 A | 4/1998 | Nishizaka et al. | 345/418 |
| 6,614,430 B1 * | 9/2003 | Rappoport | 345/420 |

FOREIGN PATENT DOCUMENTS

EP 0551543 7/1993

* cited by examiner

*Primary Examiner*—Phu Nguyen
(74) *Attorney, Agent, or Firm*—Perkins Coie LLP

(57) ABSTRACT

Methods and systems for automatically translating geometric data, such as a CAD model, from a primary file format to a secondary file format. In one embodiment, the method is carried out on a server computer that receives CAD model information and translation requirements via the Internet or an intranet computer system. For example, the server can receive a CAD model name, a secondary file format, a translation protocol, a neutral file format, a translation accuracy, and a destination for the translated model. The geometric data translation system then automatically translates the selected model in accordance with the translation requirements received. When the translation is complete, the system can automatically transmit an electronic notification to the user indicating whether or not the translation was successful. In one embodiment, this notification can include the resulting accuracy of the translation.

49 Claims, 6 Drawing Sheets

METHODS AND SYSTEMS FOR AUTOMATICALLY TRANSLATING GEOMETRIC DATA

CROSS-REFERENCE TO RELATED APPLICATION

This application contains subject matter related to the U.S. Patent Application having Attorney Reference No. 243768070US entitled "METHODS AND SYSTEMS FOR VALIDATING TRANSLATED GEOMETRY, filed concurrently with this application and having a common inventor and a common assignee. This application accordingly incorporates the cited application by reference.

TECHNICAL FIELD

The present invention relates generally to translating geometric data, and more particularly, to computer-implemented methods for automatically translating geometric data, such as CAD models, from a primary file format to a secondary file format.

BACKGROUND

Today, mechanical parts and assemblies are typically designed using computer-aided design (CAD) systems. These systems enable a designer to create a three-dimensional computer model of a part or assembly that can be viewed and manipulated on a computer display. The dimensional data for the part or assembly is stored in a computer database, and if the designer so desires, the designer can create a conventional engineering drawing from the CAD model complete with the necessary dimensions, notes and annotations to manufacture the part or assembly. The designer can also provide the CAD model, via a data storage medium such as a diskette, or a data communications link such as the Internet, to secondary users for various purposes.

Large engineering enterprises and other primary users will often create a CAD model of a part or assembly and then provide it to a secondary user, such as a manufacturer, to make the part or assembly. Most manufacturers use computer numerically controlled (CNC) machines for manufacturing of this type. CNC machines are programmed to machine parts using computer-readable instructions that provide the necessary information about the part features. These instructions are typically automatically translated from the CAD model into a format needed by the manufacturer's CNC machine.

Large engineering enterprises will also frequently enlist the support of other engineering firms to help with the design and development of new parts and assemblies. A large engineering enterprise (i.e., the primary user) will usually provide another engineering firm (i.e., the secondary user) with CAD models which define the interface requirements for the new hardware the secondary user is to design. Outsourcing such as this allows the primary user to allocate development of particular aspects of their products to specialists who can then collaborate with the primary user in arriving at the final product definition.

Regardless of whether secondary users will be using CAD models for manufacturing or for collaborative design, the CAD models should be in a format that is compatible with the secondary users' CAD systems. However, compatibility can be problematic because of the variety of CAD systems currently available and in use today. These include the Unigraphics, AutoCAD, ProEngineer, Catia and Alibre systems, just to name a few. Most are used on conventional stand-alone desktop computing systems. The Alibre system, however, is a web-based CAD system that can be used by a number of users via the Internet.

Because of the many different CAD systems available, secondary users will often be using a CAD system that varies significantly from the one originally employed by the primary user to design the part or assembly. When this occurs, the original CAD model should be translated from the primary user's "primary" CAD system to the secondary user's "secondary" CAD system so the secondary user can utilize the model as intended. For example, if the primary user utilized the Unigraphics CAD system to create a part or assembly model, and the secondary user is utilizing the AutoCAD system, then the CAD model should be translated from the Unigraphics format to the AutoCAD format before it is used by the secondary user.

To translate a CAD model from a primary CAD system (e.g., Unigraphics) to a secondary CAD system (e.g, AutoCAD), the CAD model may be first translated into a neutral file format. A neutral file format (e.g., STEP, IGES, DXF, etc.) is a file format which can be used to transfer geometric data between two different CAD systems. Once transferred, the CAD model in the neutral file format can be read directly into the secondary CAD system to create a CAD model in the secondary CAD system format.

FIG. 1 is a flow diagram illustrating a method 100 that a user, such as a primary user, can utilize for translating a CAD model from a primary file format into a secondary file format. After the CAD model has been translated into the secondary format, the primary user can record the CAD model data file onto a suitable computer-readable media, such as a magnetic tape or CD-ROM, and physically transfer the data file to a secondary user. Alternatively, the primary user can electronically transfer the data file to the secondary user via a suitable computer network, such as the Internet.

In step 102 of the method 100, the primary user manually opens a selected CAD model in the primary CAD system. "Opening" the CAD model as used here means instructing the primary CAD system to access the CAD model stored in the CAD model database so that the model can be viewed by the primary user on a display. In step 104, the primary user visually inspects the displayed model geometry to verify that it is current and is, in fact, the geometry the primary user desires to translate.

After verifying the geometry, in step 106, the primary user sequences through each step of a selected translation protocol to translate from the primary file format to the neutral file format. For example, if the neutral file format is the STEP format, then the user may elect to use either the AP 203 or AP 214 translation protocols. If other neutral file formats are selected, such as IGES or DXF, then other appropriate translation protocols should be used. In step 107, the primary user sequences through each step of a selected translation protocol to translate from the neutral file format to the secondary file format. After this step is completed, the primary user will be able to visually inspect the CAD model using the secondary CAD system.

In step 108, after the model has been translated, the primary user can check the accuracy of the translation. For example, the primary user can compare translated dimensions in the secondary CAD system to original model dimensions in the primary CAD system and verify that they are within acceptable tolerance ranges. In decision step 110, if there are additional part or assembly models to be translated, the primary user repeats steps 102 through 110 as necessary until all of the desired models have been translated to the secondary CAD system. If no further models are to be translated, then the method 100 is complete.

Many primary users, such as large engineering enterprises, have CAD model databases that contain literally thousands of different parts and assemblies. In addition, such primary users will typically have a large network of secondary CAD model users in their extended supply chains. Manually translating all of the CAD models of a primary user such as this could prove to be an extremely time consuming and tedious task. Once done, the translated models would presumably still have to be manually transferred to their respective secondary users, either physically via computer-readable media or electronically via computer network. Even when implemented electronically, this transfer is still a time consuming and manual process. In light of the labor-intensive nature of translating a large quantity of CAD models from a primary CAD system to a secondary CAD system, and then transferring them to a secondary user, a more efficient and expedient method of doing so would be desirable.

DETAILED DESCRIPTION

Figure 1:
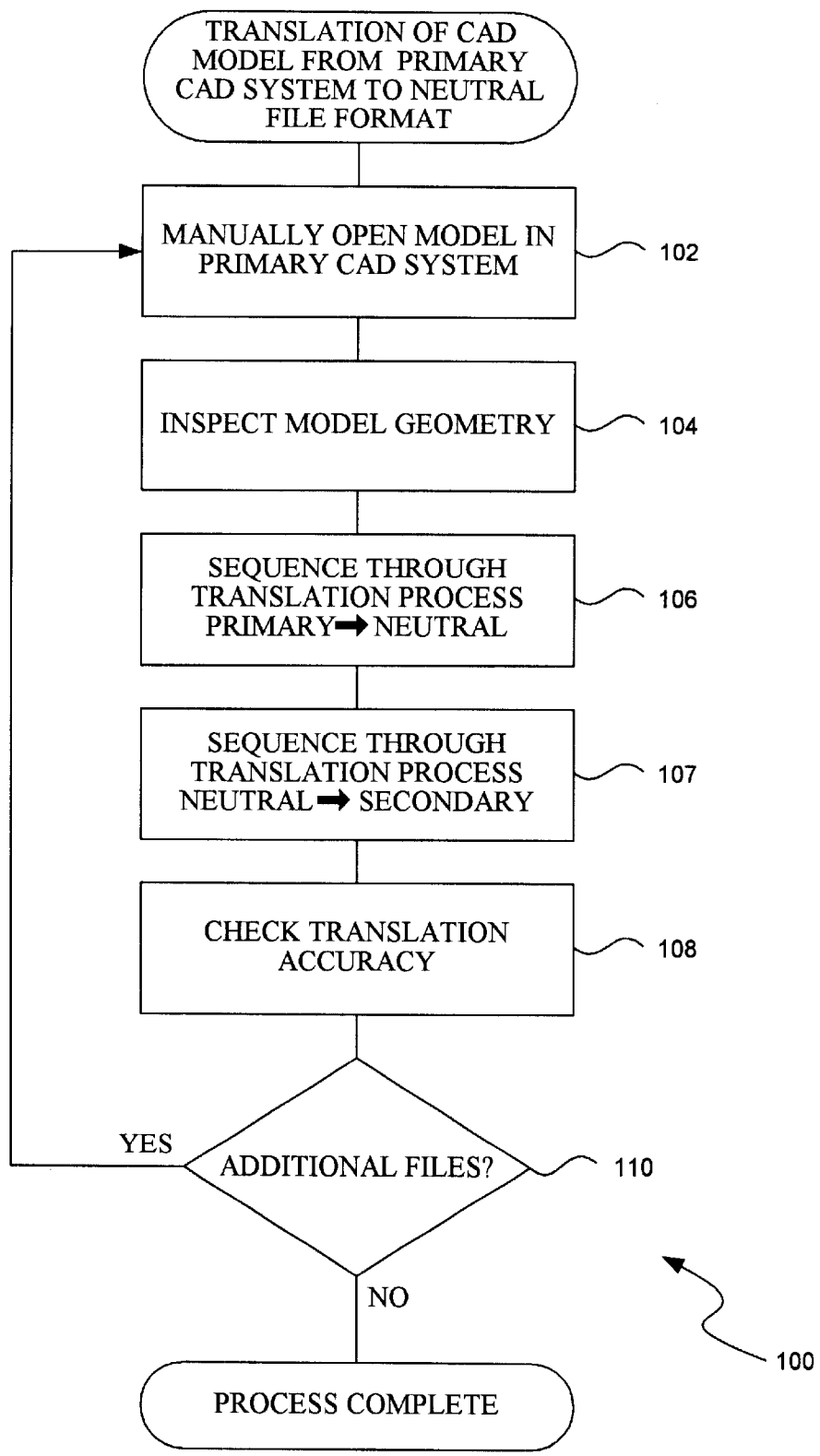
FIG. 1 is a flow diagram illustrating a method for translating a CAD model from a primary file format to a secondary file format.

Methods and systems are described for automatically translating geometric data, such as a CAD model, from a primary file format to a secondary file format. In one embodiment, the method is implemented on a general-purpose computer, such as a personal computer, by a user who accesses a web page. The user enters information on the web page corresponding to the desired translation, such as the name of the part or assembly model to be translated, the secondary file format the model is to be translated into, the destination of the translated model, and the desired accuracy of the translated geometric data. After entering this information, the user selects an appropriate icon on the web page to begin the translation process. The selected part or assembly model is then automatically translated into the selected secondary file format using the geometric data translation system in accordance with an embodiment.

In another embodiment, in addition to automatically translating CAD models from the primary file format to the secondary file format, the described methods and systems can be used to automatically transfer the translated models in the secondary file format to a web-accessible database. In one aspect of this embodiment, after the model has been automatically translated and transferred to the web-accessible database in accordance with the user's instructions, the user will receive an electronic notification, such as an email message, indicating the status of the concluded transactions.

Using the described methods, a web-accessible database can be automatically populated with a plurality of selected CAD models in selected file formats by a user, such as a primary user, who wishes to make the CAD models available to other users, such as secondary users, in the supply chain. This web-accessible database can then be accessed by secondary users by logging on to a web site connected to the database. After entering an identifier for a CAD model, the secondary users can automatically download that CAD model in a useable file format for manufacturing or for collaborating with the primary user in the design and development of interfacing parts or assemblies. If the secondary user is utilizing the CAD model for collaborative development, then after the new part and assembly models have been developed, the secondary user can transfer the new models back to the web-accessible database so that they can be accessed by the primary user, or perhaps by another secondary user, for manufacturing.

Certain embodiments of the methods and systems are described in the context of computer-executable instructions executed by a general-purpose computer, such as a personal computer. In one embodiment, for example, computer-executable instructions for automatically translating geometric data are stored on a computer-readable medium such as a floppy disk or CD-ROM. In other embodiments, these instructions are stored on a server computer system and accessed via an Intranet computer network or the Internet. Because the basic structures and functions related to computer-executable routines and corresponding computer implementation systems are well known, they have not been shown or described in detail here to avoid unnecessarily obscuring the described embodiments.

Although the following disclosure provides specific details for a thorough understanding of several embodiments of the methods and systems described, one of ordinary skill in the relevant art will understand that these embodiments can be practiced without some of these details. In other instances, it will be understood that the methods and systems disclosed can include additional details without departing from the spirit or scope of the described embodiments. Although some embodiments are described in the context of computer models, such as three-dimensional computer models created with conventional CAD systems, it will be understood that the methods and systems disclosed are usable for much broader applications, and accordingly, can be used to automatically translate other types of geometric data, such as two-dimensional geometric data.

Figure 2:
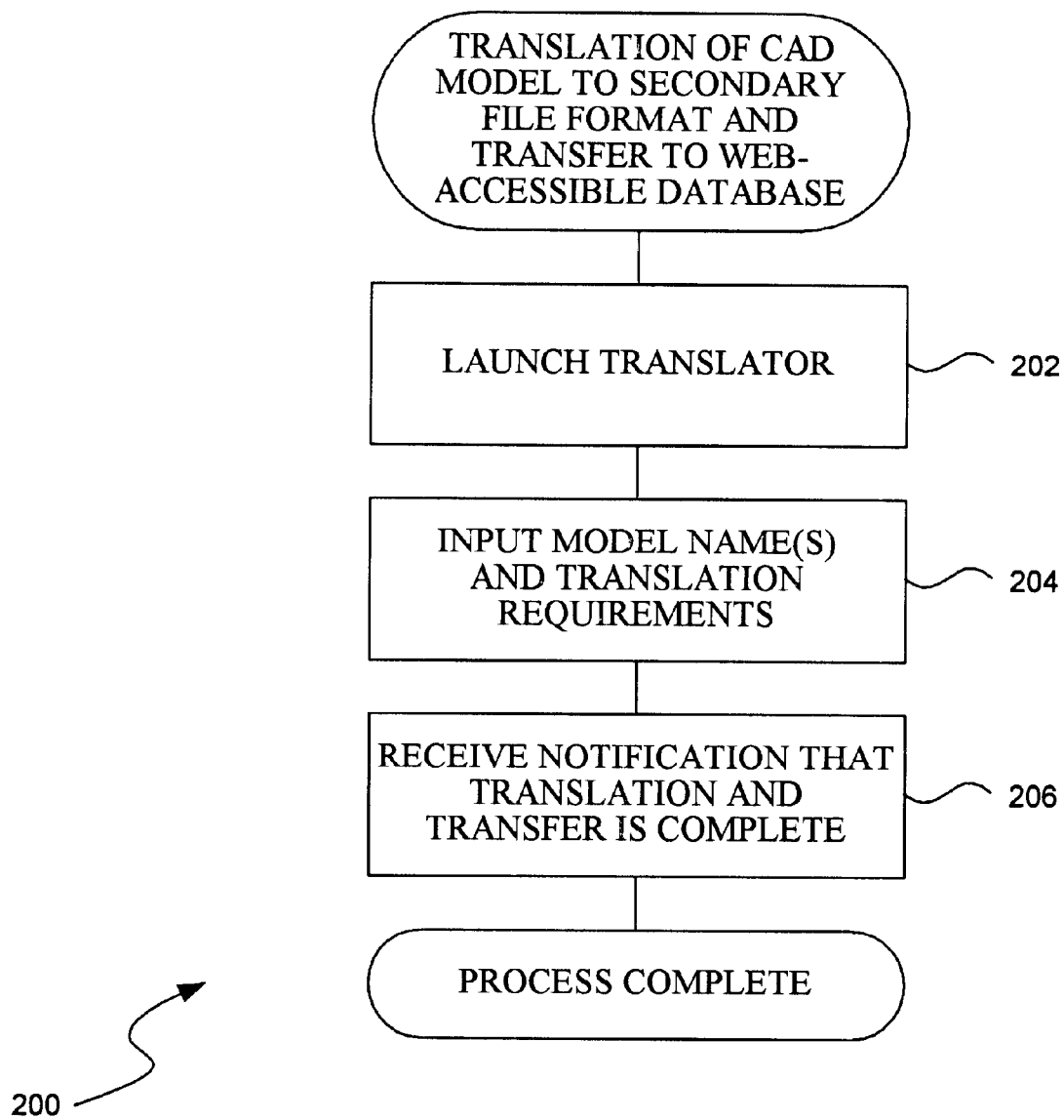
FIG. 2 is a diagram illustrating a method for translating a CAD model from a primary file format to a secondary file format, and then transferring the CAD model in the secondary file format to a web-accessible database, in one embodiment.

FIG. 2 is a diagram illustrating a method 200 for translating a CAD model from a primary file format to a secondary file format, and then transferring the CAD model in the secondary file format to a web-accessible database, in accordance with an embodiment. In block 202, a user launches a model translator. In one embodiment, launching the model translator comprises logging on to a web site and requesting a model translation web page. In block 204, the user inputs pertinent model information and translation requirements via the web page. For example, the user inputs a model identifier, such as the name and revision of the part or assembly model to be translated, a secondary file format to which the model is to be translated, a destination to which the translated model is to be transferred, and a required accuracy for the translation. The "accuracy" of the translation means, in one embodiment, the relative accuracy of the translated model dimensions as compared to the original model dimensions. In one embodiment, the user can define the required accuracy by specifying a Z score requirement for the translation. The Z score corresponds to the number of standard deviations between a process mean value and a specification limit. Accordingly, a relatively high Z score corresponds to a relatively accurate model translation.

In other embodiments, the user can specify other translation parameters on the web page in block 204. For example, the user can specify a selected best fitting method to be employed in the translation, such as the B-spline method or the least squares method. The user can also specify a neutral file format (e.g., the STEP format) and a translation protocol (e.g., AP203 or AP214) to be used in the translation. Once the required information has been entered in block 204, the user selects an icon, such as a "translate" icon, to begin the model translation and transfer sequence.

In one embodiment, after the model has been translated and transferred in accordance with the requirements input in block 204, the user will receive a notification, such as an email message, that the requested translation and transfer have been successfully completed. If a Z score has been specified by the user in block 204, the notification can include the resulting Z score, so that the user can quickly assess the accuracy of the translation. If the model has not been successfully translated and transferred, then the notification will accordingly notify the user that an error has occurred. After receiving notification of the model translation and transfer status, the process 200 is complete.

Figure 3:
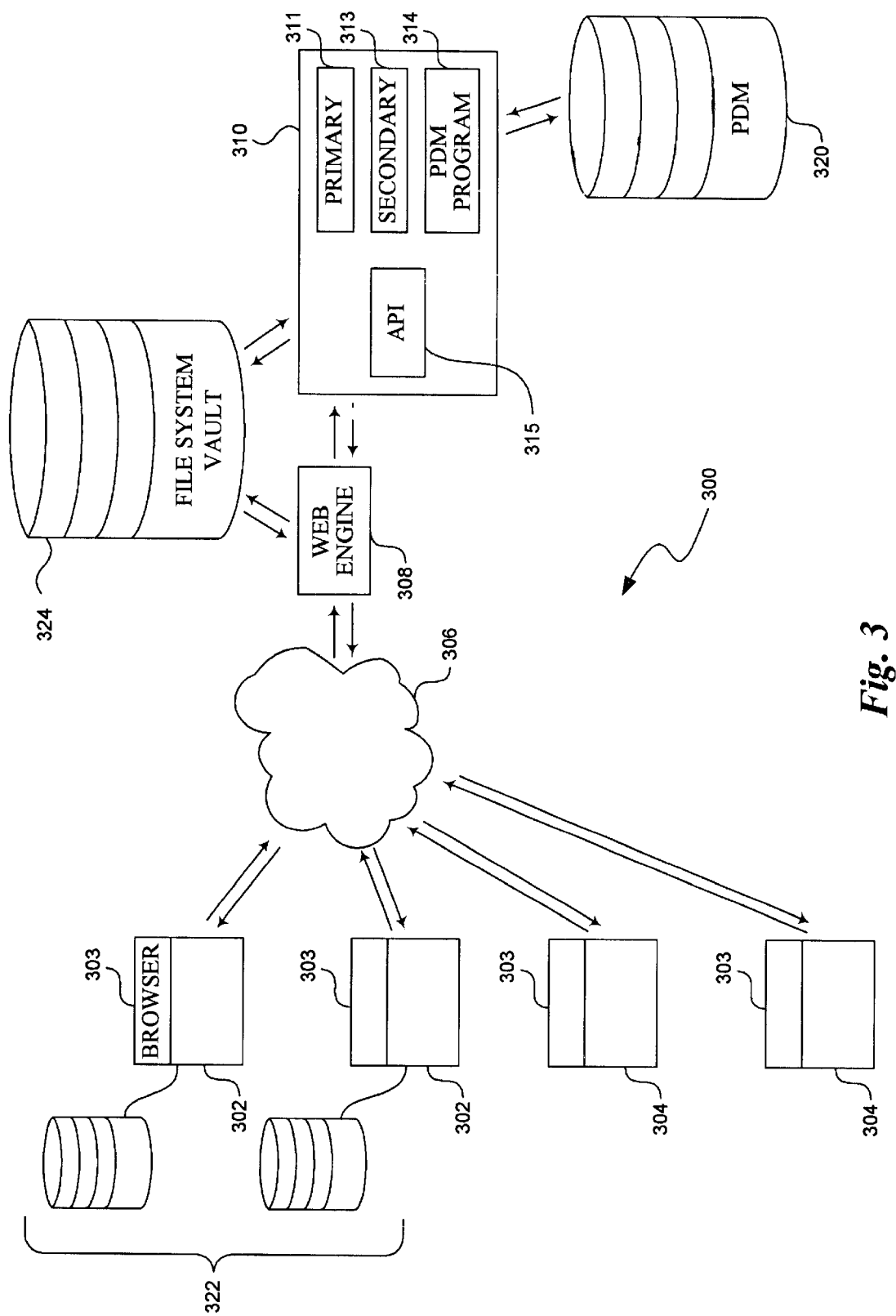
FIG. 3 is a block diagram illustrating components of a geometric data translation system in one embodiment.

FIG. 3 is a block diagram illustrating components of a geometric data translation system 300 in one embodiment. Throughout this disclosure, for ease of reference, the words "geometric data translation system" will refer to computer-implemented systems capable of geometric data transfer as well as geometric data translation. Primary user computers 302 and secondary user computers 304 are connected to a web engine 308 and a server computer 310 via an Internet 306. The primary and secondary user computers 302 and 304 may include a central processing unit, memory devices, input devices (e.g., keyboard and pointing device), output devices (e.g., display devices), and storage devices (e.g., disk drives). The memory and storage devices are computer-readable media that may contain computer instructions for implementing a primary or secondary CAD system or other components of the geometric data translation system 300. The primary and secondary user computers 302 and 304 may also include a browser module 303 that allows the user to access and exchange data with the Internet 306, including websites within the World Wide Web portion of the Internet.

A native database 322 comprises one or more databases, such as hard-drives, that are locally connected to the primary user computers 302. Accordingly, the native database 322 includes CAD models created by primary users and stored in their local file system. The native database 322 is connected, for example, via a local area network (LAN), to the server computer 310. A product data manager (PDM) database 320 includes CAD models created using a primary CAD system on the primary user computers 302. The CAD models are transferred to the server computer 310 via the LAN and stored in the PDM database 320 using the PDM file system directory.

In one embodiment, primary users can utilize the primary user computers 302 to translate selected CAD models located in the PDM database 320 or in the native database 322 from a primary file format to a secondary file format. In one aspect of this embodiment, after the selected CAD models have been translated, they are electronically transferred to a web-accessible database, such as a file system vault 324. In another aspect of this embodiment, secondary users can utilize the secondary user computers 304 to retrieve the translated CAD models in the secondary file format from the file system vault 324.

In one embodiment, the web engine 308 receives a notification that a web page has been requested by a primary user computer 302, retrieves information related to the requested web page, and provides that information to the requesting primary user computer. The web engine 308 then receives CAD model translation and transfer information from the primary user computer 302, and transmits this information to the server computer 310 to perform the requested model translation and transfer accordingly. In one aspect of this embodiment, the web engine 308 can also receive a request from a secondary user computer 304 for a translated CAD model in a secondary file format, retrieve the requested CAD model from the file system vault 324, and transmit the requested CAD model to the requesting secondary user computer 304.

The server computer 310 contains one or more central processing units (CPU) for executing programs and a computer-readable medium drive, such as a CD-ROM drive, for reading information or installing programs. The server computer 310 also contains computer-readable media containing instructions for carrying out various steps of the geometric data translation system. Users can access the server computer 310 by means of a URL, such as http://www.translator.com. The URL, or any other link or address noted herein, can be any resource locator. The server computer 310 and related web pages preferably have secure portions that may only be accessed by authorized persons, such as users presenting a selected password.

In one embodiment, the server computer 310 includes a primary CAD program 311, a secondary CAD program 313, and a PDM program 314. As is known, a product data manager (PDM) is a file directory system that can organize and store CAD models in a structured format. The server computer 310 uses the PDM program 314 to store and retrieve CAD models from the PDM database 320. The primary CAD program 311 is a three-dimensional computer modeling program (e.g., Unigraphics, AutoCAD, etc.) that contains a translation protocol (e.g., AP203 or AP214) for translating a computer model from the primary CAD file format into a neutral file format (e.g., STEP), or conversely, for translating a computer model in a neutral file format into the primary CAD file format. The secondary CAD program 313 is a three-dimensional computer modeling program different from the primary CAD program 311 (e.g, Alibre, ProEngineer, etc.) that also contains a translation protocol (e.g., AP203 or AP214) which functions in substantially the same manner as the translation protocol contained in the primary CAD program.

The server computer 310 can implement a routine in accordance with an embodiment that retrieves a CAD model from the PDM database using the PDM program 314, and then translates the retrieved CAD model from the primary CAD file format into a neutral file format using a translation protocol contained in the primary CAD program 311. The CAD model can then be translated from the neutral file format into the secondary CAD file format using a translation protocol contained in the secondary CAD program 313. The CAD model can then be transferred to the file system vault 324 for storage in the secondary CAD file format. The server computer 310 can implement a similar routine for translating and transferring a CAD model retrieved from the native database 322.

The server computer 310 also includes an application program interface (API) 315. As discussed in greater detail below, when the server computer 310 is translating a CAD model retrieved from the native database 322, the API 315 will implement the translation protocol contained in the primary CAD program 311 to translate the CAD model from the primary CAD file format to a neutral file format. When the server computer 310 is translating a CAD model retrieved from the PDM database 320, an API contained in the primary CAD program 311 will automatically perform this function.

One skilled in the relevant art will appreciate that the concepts of the geometric data translation system 300 can be implemented in various environments other than the Internet. For example, the concepts can also be implemented in an electronic mail environment in which the electronic mail messages include the equivalent of a CAD model name and associated translation requirements. In addition, communication networks other than the Internet may also be used, such as a local area network, a wide area network, or a point-to-point dial-up connection. Other devices can be used to launch the conversion as well. For example, personal data assistants (PDA) and two-way pagers may be used in some embodiments. The concepts of the geometric data translation system may also be used in a single-computer environment rather than a client/server environment as illustrated. Consistent with these variations, the server computer 310 may comprise any combination of hardware or software that can support these concepts. In particular, the server computer 310 may actually include multiple computers. Similarly, the user computers 302 and 304 may comprise any combination of hardware or software that interacts with the server computer 310 as described above. For example, these user computers may include television-based systems and various other computational devices through which web pages may be accessed.

Figure 4:
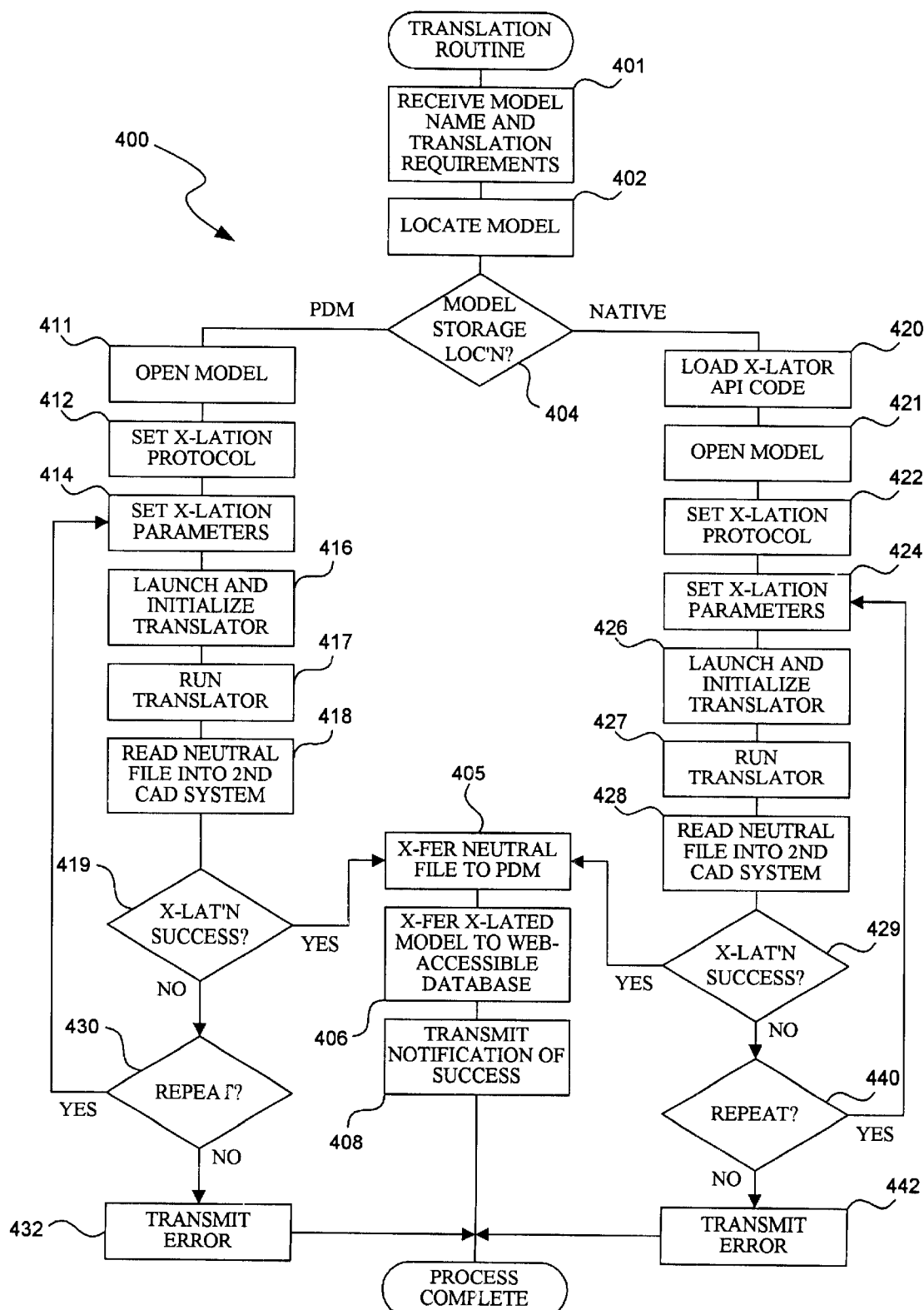
FIG. 4 is a flow diagram illustrating a routine for translating a CAD model from a primary file format to a secondary file format, and then transferring the CAD model in the secondary file format to a web-accessible database, in one embodiment.

FIG. 4 is a flow diagram illustrating a routine 400 for translating a CAD model from a primary file format to a secondary file format, and for transferring the translated CAD model to a web-accessible database, in accordance with an embodiment. In one embodiment, the routine 400 is implemented by the server computer 310 (FIG. 3). In other embodiments, the routine 400 can be implemented using other computer systems. Although the routine 400 is described below in the context of a single CAD model translation and transfer, it will be understood by those of ordinary skill in the relevant art that the methods and systems disclosed also apply to automatic translation of multiple models.

In block 401, the routine 400 receives CAD model information and translation requirements. In one embodiment, this CAD model information can include one or more model identifiers, such as the names and revision letters of various CAD models to be translated. Each CAD model can be associated with translation and transfer requirements that can include a secondary file format, a destination database for the translated file, and a dimensional accuracy of the translation. In one embodiment, specifying the model translation accuracy means specifying a Z score corresponding to the model translation. In other embodiments, other accuracy requirements may be specified. In another embodiment, each CAD model can be further associated with additional translation and transfer requirements in block 401. For example, these additional requirements can include a translation protocol and a neutral file format. Additional translation parameters can also be associated with each CAD model in block 401. For example, these additional parameters can include a best-fit method, such as the B-spline or least squares method.

In an alternate embodiment, some or all of the translation requirements received in block 401 can be preset as default requirements. For example, the secondary file format can be preset to the Alibre CAD file format, the destination database can be preset to the file system vault 324 (FIG. 3), and the dimensional accuracy can be preset to a Z score of 3.25. Similarly, the neutral file format could be preset to STEP and the translation protocol could be preset to STEP AP214.

In block 402, the routine 400 locates the CAD model specified in block 401. In one aspect of this embodiment, the routine 400 will search for the CAD model in either the PDM database 320 or the native database 322 (FIG. 3). In decision block 404, the routine 400 determines if the specified CAD model is located in the native database 322 or the PDM database 320. If the CAD model is located in the PDM database 320, then in block 411, the routine 400 retrieves the CAD model from the PDM database and opens the model using the primary CAD program 311 (FIG. 3).

The routine 400 sets a translation protocol in block 412. In one embodiment, this is the translation protocol (e.g. AP214) received in block 401. In other embodiments, this translation protocol can be preset in the routine 400. In block 414, the routine 400 sets additional translation parameters. In one embodiment, these additional translation parameters can include the best fitting method (e.g., the B-spline method) received in block 401. In other embodiments, these additional translation parameters can also include the neutral file format, the translation accuracy, and the destination of the translated file, as received in block 401.

In block 416, the routine 400 launches and initializes the translator. In one embodiment, the translator is included in the primary CAD program 311 (FIG. 3). In block 417, the routine 400 runs the translator. When working in the PDM environment, the CAD program 311 can interface directly with the PDM program 314 to implement the selected translation protocol (e.g., AP214) and translate the specified CAD model from the primary CAD file format to the specified neutral file format. In block 418, the routine 400 translates the CAD model from the neutral file format into the secondary file format.

In decision block 419, the routine 400 determines if the model translation from the primary CAD file format to the secondary CAD file format was successful. In one embodiment, this determination can be based on calculating a Z score corresponding to the translated model and comparing the calculated Z score to the Z score requirement received in block 401. If the calculated Z score is greater than or equal to the requirement, and the translation is accordingly determined to be a success, then in block 405 the routine 400 transfers a version of the CAD model in the neutral file format to the PDM database 320 (FIG. 3). This transfer can be performed using an appropriate transfer protocol, such as the file transport protocol (FTP). In one aspect of this embodiment, the version in the neutral file format can be stored in the same file folder in the PDM database 320 where the version of the CAD model in the primary CAD file format is stored. In block 406, the routine 400 transfers a version of the CAD model in the secondary file format to the a web-accessible database, such as the file system vault 324 (FIG. 3). This transfer can also be performed using FTP.

In one aspect of this embodiment, the geometric data translation system described above allows primary users to retrieve models in neutral file format from the PDM database 320 and download these models directly into their CAD systems, regardless of the particular type of CAD system a primary user happens to be using. This system also allows secondary users to retrieve CAD models in a compatible secondary file format from a web-accessible database for manufacture or for collaborative development without first having to translate the CAD model into a format that is compatible with their particular CAD system.

In block 408, the routine 400 transmits an electronic notification to the primary user who requested the translation indicating that the translation of the CAD model to the secondary file format and the transfer of the translated CAD model to the web-accessible database have been successfully accomplished. In one embodiment, this electronic notification is an email message. In other embodiments, other forms of electronic notification can be used. In one aspect of this embodiment, the notification can include the resulting Z score corresponding to the model translation. By providing the user with the resulting Z score, the routine 400 provides the user with a means to gauge the accuracy of the translation.

Returning to decision block 419, if the model translation is not successful, for example, because the calculated Z score did not meet the specified requirement, then the routine 400 proceeds to decision block 430. In decision block 430, the routine 400 determines if it can repeat the translation sequence using different translation parameters. These different translation parameters can include different best-fit methods or, possibly, different methods for constructing the translated model during the translation sequence. If the translation cannot be repeated, then in block 432, the routine 400 transmits an error notification to the user indicating that the translation was unsuccessful. If, instead, it is possible to repeat the translation with different parameters, then the routine 400 returns to block 414 and changes selected translation parameters accordingly.

In one embodiment, the different translation parameters may be preselected and stored. For example, in one embodiment, a best-fit translation parameter can be automatically reset in block 414. For example, if the initial best fit method was the least squares method, then in block 414 this parameter could be automatically changed to the B-spline method. In other embodiments, other translation parameters, such as the method for constructing the translated model, could be automatically changed in block 414 in an attempt to successfully translate the model. The phrase "method for constructing the translated model" as used here refers to how a CAD model is assembled in the computer database. If, in a first method, model features are constructed sequentially from adjacent features, then a second method may be available wherein the model features are constructed from a common datum in an effort to enhance the accuracy of the translation.

In an alternate embodiment, the routine 400 can prompt a user to input new translation parameters in block 414 as a result of a previously unsuccessful model translation attempt. For example, in this embodiment, the routine 400 can send an email message to the user indicating that the translation was unsuccessful and requesting the user to input different translation requirements. The routine 400 might request the user to enter a different Z score or a different best fit method. In another aspect of this embodiment, if the routine 400 was unable to transfer the translated CAD model to the specified web-accessible database, then the routine might send a request to the user asking for a new destination database in which to place the translated CAD model.

After the new translation parameters have been set in block 414, the routine 400 repeats blocks 416, 417, 418 and 419 as explained above. If, in decision block 419, the translation is still unsuccessful, and if, in decision block 430, repeating the translation is not an option (e.g., all possible combinations of translation parameters have been tried), then in block 432 the routine 400 transmits an error message to the user indicating that the translation has been unsuccessful.

Returning to decision block 404, if the routine 400 determines that the specified CAD model is located in the native database 322, then in block 420 the routine begins the translation by loading an API code that will implement the translation protocol contained in the primary CAD program (FIG. 3). In block 421, the routine 400 retrieves the specified CAD model from the native database 322 and opens the model using the primary CAD program 311. The routine 400 then performs blocks 422 and 424 in a substantially similar manner as explained above with respect to blocks 412 and 414.

In block 426, the routine 400 launches and initializes the translator contained in the primary CAD program 311 (FIG. 3). In block 427, the routine 400 runs or executes the translator and translates the specified CAD model from the primary CAD file format to a neutral file format. Block 427 differs from block 417 in that the API code loaded in block 420 is used to run the translator in block 427, whereas in the PDM environment of block 417, the PDM program 314 (FIG. 3) is used to run the translator. The remainder of the routine 400 after block 427 is performed in a substantially similar manner as the corresponding blocks described above for a CAD model retrieved from the PDM database 320. Therefore, this portion of the routine does not require further description here.

Figure 5:
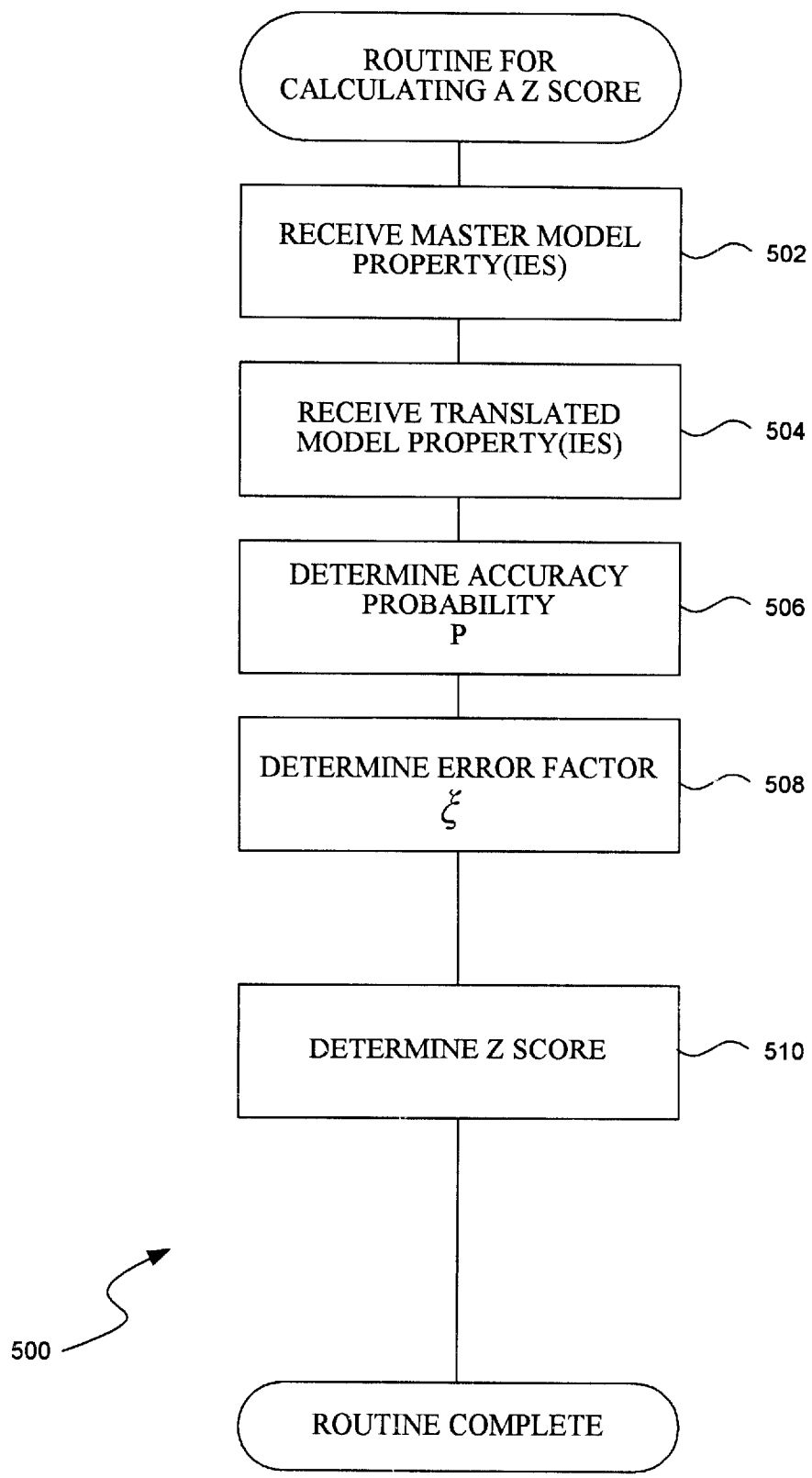
FIG. 5 is a flow diagram of a routine for calculating a Z score in one embodiment.

FIG. 5 is a flow diagram of a routine 500 for calculating a Z score in one embodiment. The routine 500 can be implemented in one embodiment on a general-purpose computer, such as a personal computer, following computer-executable instructions stored on a computer-readable medium, such as a CD-ROM or floppy disk. In other embodiments, the routine 500 can be implemented on the server computer 310 and accessed via an Intranet computer network or the Internet 306 in accordance with the geometric data translation system described herein.

In block 502, the routine 500 receives a primary CAD model geometric property. The received primary CAD model property can be either a model area or a model volume. In one embodiment, the model volume is used because this property is a cubic term which may result in a Z score that is more accurate than one determined using the model area squared term. In other embodiments, the model area can be used where a squared term can provide the necessary accuracy. Most, if not all, conventional CAD systems capable of producing three-dimensional models can readily provide the user with the model volume or model area upon request. This request often comprises entering a selected keystroke command or selecting a particular icon on a menu display. In block 504, the routine receives a translated or secondary CAD model geometric property. The geometric property received in block 504 for the secondary CAD model should be the same property that was received in block 502 for the primary CAD model. For example, if the volume of the primary CAD model was received in block 502, then the volume of the secondary CAD model should also be received in block 504.

In block 506, the routine 500 determines an Accuracy Probability P. In one embodiment, the Accuracy Probability is defined as the probability that the translated model will be sufficiently accurate to meet its original design intent, or in other words, the probability of no error. In this embodiment, the Accuracy Probability can be calculated using equation 1 below:

EQN (1):

When the translated geometric property is smaller than the corresponding master geometric property, then:

$$P = \frac{\text{Translated property}}{\text{Master property}}$$

When the translated geometric property is larger than the corresponding master geometric property, then:

$$P = \frac{2 \times (\text{Master property}/\text{Translated property}) - 1}{(\text{Master property}/\text{Translated property})}$$

In block 508, the routine determines the probability of a defect or the Error Factor $\xi$. In one embodiment, the Error Factor represents the probability that the secondary CAD model geometry will fall outside of the specified limits, that is, that the secondary CAD model geometry will be insufficiently accurate. The Error Factor can be calculated in this embodiment using the Accuracy Probability P and equation 2 below:

$$\xi = 1 - P \quad \text{EQN (2):}$$

In block 510, the routine calculates a Z score using the Error Factor $\xi$. As described above, the Z score represents the accuracy of the secondary CAD model geometry relative to the primary CAD model geometry, and can be calculated in one embodiment using equation 3 below:

EQN(3):

$$Z = \sqrt{\ln\left(\frac{1}{\xi^2}\right)} - \frac{2.515517 + 0.802853\sqrt{\ln\left(\frac{1}{\xi^2}\right)} + 0.010328\left(\sqrt{\ln\left(\frac{1}{\xi^2}\right)}\right)^2}{1 + 1.432788\sqrt{\ln\left(\frac{1}{\xi^2}\right)} + 0.189269\left(\sqrt{\ln\left(\frac{1}{\xi^2}\right)}\right)^2 + 0.001308\left(\sqrt{\ln\left(\frac{1}{\xi^2}\right)}\right)^3}$$

Equation 3 was derived from an evaluation of highly nonlinear geometry variations, and is the basis for determining an accurate Z score for geometries that closely match the original design intent but have distinctly small differences in high level model attributes. Once a Z score has been determined for the secondary CAD model geometry using equation 3, it can be compared to a selected pass/fail criteria to determine if the translated model is sufficiently accurate for use in manufacturing or for collaborative design.

Figure 6:
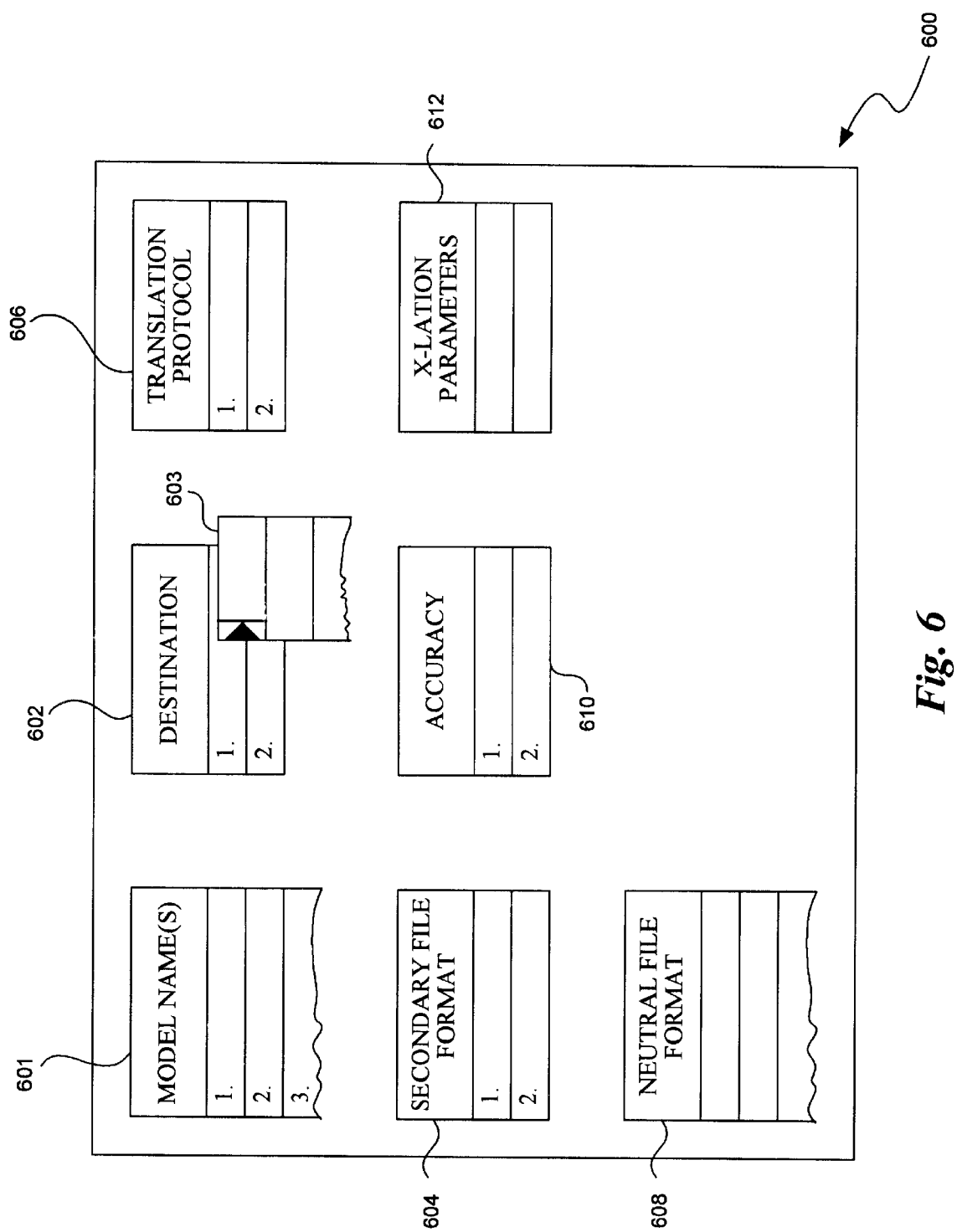
FIG. 6 is a diagram illustrating a display description for entering CAD model information and corresponding translation and transfer requirements in one embodiment.

FIG. 6 is a diagram illustrating a display description 600, such as a web page, for entering CAD model information and corresponding translation and transfer requirements in one embodiment. In one aspect of this embodiment, the display description 600 can be presented on a display of a general-purpose user computer, such as a typical personal computer. The user enters selected information on the display description 600 to translate a selected CAD model from a primary CAD file format to a secondary CAD file format, and transfer the CAD model in the secondary CAD file format to a selected database, such as a web-accessible database.

The display description 600 includes a CAD model identification field 601, a destination field 602, a secondary CAD file format field 604, a translation protocol field 606, a neutral file format field 608, an accuracy field 610, and other translation parameter fields 612. The CAD model identification field 601 can receive one or more CAD model names and revision letters in a list format. The selected destinations for the one or more translated versions of the CAD models are accordingly listed in corresponding order in the destination field 602. For example, if some of the translated CAD models are to be stored in the web-accessible database after translation, then this database is specified in the appropriate rows of the destination field 602 that correspond to these CAD models. In addition, a dropdown list, such as the drop-down list 603, can be included with the destination field 602. The drop-down list 603 can present some or all of the destination options available to the user. Selecting a destination from the drop-down list 603 will accordingly cause that destination to be inserted in the corresponding row of the destination field 602. In a similar manner, each of the remaining fields on the web page 600 can include drop-down lists presenting available options for those fields.

Selected secondary CAD file formats that the one or more CAD models listed in the CAD model identification field 601 are to be translated to are accordingly listed in corresponding order in the secondary CAD file format field 604. A translation protocol corresponding to each selected model can also be entered in the translation protocol field 606. Similarly, selected neutral file formats can be specified in the neutral file format field 608, and an accuracy for each of the translated models can be entered by the user in the accuracy field 610. In one embodiment, the accuracy can comprise a Z score as described above. In other embodiments, other accuracy parameters can be specified. For example, a percentage deviation between the master model and the translated model corresponding to either volume or area could be selected in an alternate embodiment. Additional translation parameters, such as best fitting methods or model construction methods, as described above, can be entered by the user in the additional translation parameter field 612. The field 612 can also include associated drop-down lists so that the user can select from preset translation parameter options.

As will be apparent to those of ordinary skill in the relevant art, a web page for receiving model information and translation requirements can omit certain of the aspects disclosed above in accordance with FIG. 6. In other instances, it will be understood that other web pages can include other information in addition to that provided by the web page 600 without departing from the spirit or scope of the web page 600 described above. Accordingly, after the user has entered the required model information and translation requirements onto the web page 600, the user selects a translate icon 620 to begin the model translation and transfer process in accordance with the geometric data translation system and methods described above.

From the foregoing, it will be appreciated that, although specific embodiments of the geometric data translation system have been described above for purposes of illustration, various modifications may be made without deviating from the spirit or scope of the invention. For example, user-supplied information regarding the CAD model to be translated can be associated with resources other than a web page. For example, the information can be associated with any URL or any display description that describes the pertinent model information and translation requirements. Further, although the translation routine has been described above as using particular translation protocols, neutral file formats, and other translation requirements in a particular sequence, those of ordinary skill in the relevant art will appreciate that other translation protocols and requirements can be used in other sequences in a similar fashion consistent with the present disclosure. These and other changes can be made to the invention in light of the above detailed description.

Accordingly, in the following claims, the terms used should not be construed to limit the invention to the specific embodiments disclosed in the specification and the claims, but should be construed to include all geometric data translation and/or transfer systems that operate in accordance with the claims to provide a method for automatically translating geometric data from a primary CAD system to a neutral CAD format, or to a secondary CAD file format. Accordingly, the invention is not limited by this disclosure, but instead, the scope of the invention is to be determined entirely by the claims.

I claim:

1. A method in a computer system for automatically translating a CAD model from a primary file format to a secondary file format and storing the CAD model in a web-accessible database in the secondary file format, the method comprising:

receiving a CAD model identifier that identifies a selected CAD model in the primary file format;

in response to the received CAD model identifier, locating the selected CAD model in a first database;

retrieving the selected CAD model from the first database;

opening the selected CAD model;

setting a translation Protocol for translating the selected CAD model from the primary file format to a neutral file format;

translating the selected CAD model from the primary file format to the neutral file format;

translating the selected CAD model from the neutral file format to the secondary file format;

receiving a destination comprising the web-accessible database;

receiving a translation accuracy requirement;

in response to the received translation accuracy requirement, determining the accuracy of the translation of the selected CAD model from t e primary file format to the secondary file format; and in response to the received destination, storing the selected CAD odel in the web-accessible database in the secondary file format.

2. The method of claim 1 wherein the first database is a PDM database, and further comprising storing the selected CAD model in the neutral file format in the PDM database.

3. The method of claim 1 wherein the first database is a PDM database and the selected CAD model is retrieved from a file folder in the PDM database, and further comprising storing the selected CAD model in the neutral file format in the file folder in the PDM database.

4. The method of claim 1 wherein the first database is a native database.

5. The method of claim 1 wherein translating the selected CAD model from the primary file format to the neutral file format comprises: launching a translator that implements the set translation protocol; and executing the launched translator.

6. The method of claim 1 wherein the first database is a native database, and wherein translating the selected CAD model from the primary file format to the neutral file format comprises:

loading an application program interface (API);

launching a translator that implements the set translation protocol; and executing the launched translator by implementing the API.

7. The method of claim 1 wherein the neutral file format is the STE file format.

8. The method of claim 1 wherein the set translation protocol is AP203 or AP214.

9. The method of claim 1 wherein the primary file format is Unigraphics, the neutral file format is STEP, and the secondary file format is Alibre.

10. The method of claim 1 further comprising:

receiving a translation protocol; and in response to the received translation protocol, setting the translation protocol to be the received translation protocol.

11. The method of claim 1 further comprising:

receiving a best-fit method; and in response to the received best-fit method, translating the selected CAD model from the primary file format to the neutral file format, and from the neutral file format to the secondary file format, by implementing the received best-fit method.

12. A method in a computer system for automatically translating a CAD model from a Primary file format to a secondary file format and storing the CAD model in a web-accessible database in the secondary file format, the method comprising:

receiving a CAD model identifier that identifies a selected CAD model in the primary file format;

in response to the received CAD model identifier, locating the selected CAD model in a first database;

retrieving the selected CAD model from the first database;

opening the selected CAD model;

setting a translation protocol for translating the selected CAD model from the primary file format to a neutral file format;

translating the selected CAD model from the primary file format to the neutral file format;

translating the selected CAD model from the neutral file format to the secondary file format;

receiving a translation accuracy requirement;

in response to the received translation accuracy requirement, determining the accuracy of the translation of the selected CAD model from the primary file format to the secondary file format; and when the determined translation accuracy meets or exceeds the received translation accuracy requirement, transmitting an electronic notification indicating the selected CAD model has been successfully translated; and storing the selected CAD model in the web-accessible database in the secondary file format.

13. The method of claim 12 wherein the received translation accuracy requirement is a Z score.

14. The method of claim 12 wherein the electronic notification is an email message.

15. A method in a computer system for automatically translating a CAD model from a primary file format to a secondary file format, the method comprising:

receiving a CAD model identifier that identifies a selected CAD model in the primary file format:

in response to the received CAD model identifier, automatically retrieving the selected CAD model from a first database:

automatically setting a translation Protocol for translating the selected CAD model from the primary file format into a neutral file format:

receiving a best-fit method; and in response to the received best-fit method, automatically translating the selected CAD model from the primary file format to the neutral file format by automatically implementing the received best-fit method.

16. The method of claim 15 further comprising automatically storing the selected CAD model in the neutral file format in the first database.

17. The method of claim 15 wherein the first database is a PDM database, and further comprising automatically storing the selected CAD model in the neutral file format in the PDM database.

18. The method of claim 15 wherein the first database is a PDM database and the selected CAD model is retrieved from a file folder in the PDM database, and further comprising automatically storing the selected CAD model in the neutral file format in the file folder in the PDM database.

19. The method of claim 15 further comprising automatically translating the selected CAD model in the neutral ffie format from the neutral file format to the secondary file format.

20. The method of claim 15 further comprising:

automatically translating the selected CAD model in the neutral file format from the neutral file format to the secondary file format; and automatically storing the selected CAD model in the secondary file format in a second database.

21. The method of claim 15 further comprising:

automatically storing the selected CAD m del in the neutral file format in the first database automatically translating the selected CAD model in the neutral file format from the neutral file format to the secondary file format; and automatically storing the selected CAD model in the secondary file format in a second database.

22. The method of claim 21 wherein the first database is a PDM database and the second database is a web-accessible database.

23. The method of claim 15 the first database is a native database, and further comprising:

automatically translating the selected CAD model in the neutral file format from the neutral file format to the secondary file format; and automatically storing the selected CAD model in the secondary file format in a second database.

24. The method of claim 23 wherein the second database is a web-accessible database.

25. The method of claim 15 wherein automatically translating the selected CAD model from the primary file format to the neutral file format comprises:

automatically launching a translator that implements the set translation protocol; and automatically executing the launched translator.

26. The method of claim 15 wherein the first database is a native database, and wherein automatically translating the selected CAD model from the primary file format to the neutral file format comprises:

automatically loading an application program interface (API);

automatically launching a translator that implements the set translation protocol; and automatically executing the launched translator by implementing the API.

27. The method of claim 15 wherein the neutral file format is the STEP file format and the translation protocol is AP203 or AP214.

28. The method of claim 15 wherein the primary CAD file format is Unigraphics and the secondary file format is Alibre.

29. The method of claim 15 further comprising:

receiving a destination comprising a second database automatically translating the selected CAD model in the neutral file format from the neutral file format to the secondary file format; and in response to the received destination, automatically storing the selected CAD model in the secondary file format in the second database.

30. The method of claim 29 wherein the second database is a web-accessible database.

31. The method of claim 15 further comprising:

receiving a translation accuracy requirement;

automatically translating the selected CAD model in the neutral file format from the neutral file format to the secondary file format;

in response to the received translation accuracy requirement, automatically determining the accuracy of the translation of the selected CAD model from the primary file format to the secondary file format;

when the determined translation accuracy meets or exceeds the received translation accuracy requirement, automatically storing the selected CAD model in the secondary file format in a web-accessible database automatically transmitting a first electronic notification indicating the selected CAD model has been successfully translated; and when the determined translation accuracy is less than the received translation accuracy requirement, automatically transmitting a second electronic notification indicating the selected CAD model has not been successfully translated.

32. The method of claim 31 wherein the first and second electronic notifications are email messages.

33. A method in a computer system for automatically translating a CAD model from a primary file format to a secondary file format, the method comprising:

receiving a CAD model identifier that identifies a selected CAD model in the primary file format;

in response to the received CAD model identifier, automatically retrieving the selected CAD model from a first database;

automatically setting a translation protocol for translating the selected CAD model from the primary file format into a neutral file format;

automatically translating the selected CAD model from the primary file format to the neutral file format;

automatically translating the selected CAD model in the neutral file format from the neutral file format to the secondary file format; and automatically determining the accuracy of the translation of the selected CAD model from the primary file format to the secondary file format.

34. A computer-readable medium whose contents cause a computer system to automatically translate a CAD model from a primary file format to a secondary file format, the CAD model being translated by a method comprising:

receiving a CAD model identifier that identifies a selected CAD model in the primary file format;

in response to the received CAD model identifier, locating the selected CAD model in a first database;

opening the selected CAD model;

setting a translation protocol for translating the selected CAD model from the primary file format to a neutral file format;

translating the selected CAD model from the primary file format to the neutral file format;

translating the selected CAD model from the neutral file format to the secondary file format;

receiving a translation accuracy requirement;

in response to the received translation requirement, determining the accuracy of the translation of the selected CAD model from the primary file format to the secondary file format; and when the determined translation accuracy meets or exceeds the received translation accuracy requirement, transmitting an electronic notification indicating the selected CAD model has been successfully translated.

35. A computer-readable medium whose contents cause a computer system to automatically translate a CAD model from a primary file format to a secondary file format and store the CAD model in the secondary file format in a web-accessible database, the CAD model being translated and stored by a method comprising:

receiving a CAD model identifier that identifies a selected CAD model in the primary file format;

in response to the received CAD model identifier, locating the selected CAD model in a first database;

opening the selected CAD model;

setting a translation protocol for translating the selected CAD model from the primary file format to a neutral file format;

translating the selected CAD model from the primary file format to the neutral file format;

translating the selected CAD model from the neutral file format to the secondary format;

receiving a translation accuracy requirement;

in response to the received translation requirement, determining the accuracy of the translation of the selected CAD model from the primary file format to the secondary file format;

when the determined translation accuracy meets or exceeds the received translation accuracy requirement, transmitting an electronic notification indicating the selected CAD model has been successfully translated; and storing the selected CAD model in the secondary file format in the web-accessible database.

36. The computer-readable medium of claim 35 wherein the first database is a native database, and wherein translating the selected CAD model from the primary file format to the neutral file format comprises:

loading an application program interface (API);

launching a translator that implements the set translation protocol; and executing the launched translator by implementing the API.

37. A computer system for automatically translating a CAD model from a primary file format to a secondary file format, the computer system comprising:

means for receiving a CAD model identifier that identifies a selected CAD model in the primary file format;

means for automatically retrieving the selected CAD model from a first database in response to the received CAD model identifier;

means for automatically setting a translation protocol for translating the selected CAD model from the primary file format to a neutral file format;

means for automatically translating the selected CAD model from the primary file format to the neutral file format;

means for automatically translating the selected CAD model in the neutral file format from the neutral file format to the secondary file format; and means for automatically determining the accuracy of the translation of the selected CAD model from the primary file format to the secondary file format.

38. The computer system of claim 37 further comprising:

means for automatically storing the selected CAD model in the secondary file format in a second database.

39. The computer system of claim 37 further comprising:

means for automatically storing the selected CAD model in the neutral file format in the first database; and means for automatically storing the selected CAD model in the secondary file format in a second database.

40. The computer system of claim 37 wherein the means for automatically translating the selected CAD model from the primary file format to the neutral file format comprises:

means for automatically launching a translator that implements the set translation protocol; and means for automatically executing the launched translator.

41. The computer system of claim 37 wherein the first database is a native database, and wherein the means for automatically translating the selected CAD model from the primary file format to the neutral file format comprises:

means for automatically loading an application program interface (API);

means for automatically launching a translator that implements the set translation protocol; and means for automatically executing the launched translator by implementing the API.

42. The computer system of claim 37 further comprising:

means for receiving a destination comprising a second database; and means for automatically storing the selected CAD model in the secondary file format in the second database in response to the received destination.

43. The computer system of claim 42 wherein the second database is a web-accessible database.

44. The computer system of claim 37 further comprising:

means for receiving a translation accuracy requirement;

means for automatically translating the selected CAD model in the neutral file format from the neutral file format to the secondary file format;

means for automatically determining the accuracy of the translation of the selected CAD model from the primary file format to the secondary file format in response to the received translation accuracy requirement;

means for automatically transferring the selected CAD model in the secondary file format to a web-accessible database when the determined translation accuracy meets or exceeds the received translation accuracy requirement; means for automatically transmitting a first electronic notification indicating the selected CAD model has been successfully translated when the determined translation accuracy meets or exceeds the received translation accuracy requirement; and means for transmitting a second electronic notification indicating the selected CAD model has not been successfully translated when the determined translation accuracy is less than the received translation accuracy requirement.

45. The computer system of claim 44 wherein the first and second electronic notifications are email messages.

46. The computer system of claim 44 wherein the received translation accuracy requirement is a Z score.

47. A computer-readable medium containing a display description for receiving a CAD model identifier that identifies a selected CAD model in a primary file format, the received CAD model identifier being transmittable to a computer system via a computer network, the computer system automatically translating the identified CAD model from the primary file format to a neutral or secondary file format in response to receiving the transmitted CAD model identifier, the display description comprising:

a CAD model identification field for receiving one or more identifiers of selected CAD models to be translated from the primary file format to the secondary file format; and a translation accuracy field for receiving one or more translation accuracy requirements for the translations of the one or more selected CAD models from the primary file format to the secondary file format.

48. The computer-readable medium of claim 47 wherein the display description further comprises:

a destination field for receiving one or more databases for storage of the one or more selected CAD models after the selected CAD models have been translated to the secondary file format.

49. The computer-readable medium of claim 47 wherein the display description further comprises:

a translation protocol field for receiving one or more translation protocols for translating the one or more selected CAD models from the primary file format to the secondary file format.

\* \* \* \* \*